(12) United States Patent
Takayama et al.

(10) Patent No.: US 7,928,547 B2
(45) Date of Patent: Apr. 19, 2011

(54) OPTICAL SEMICONDUCTOR DEVICE

(75) Inventors: Yoshiki Takayama, Shiga (JP);
Masanori Minamio, Osaka (JP);
Tetsushi Nishio, Kyoto (JP)

(73) Assignee: Panasonic Corporation, Osaka (JP)

( * ) Notice: Subject to any disclaimer, the term of this patent is extended or adjusted under 35 U.S.C. 154(b) by 203 days.

(21) Appl. No.: 12/244,324

(22) Filed: Oct. 2, 2008

(65) Prior Publication Data
US 2009/0184335 A1 Jul. 23, 2009

(30) Foreign Application Priority Data
Jan. 23, 2008 (JP) ................. 2008-013049

(51) Int. Cl.
*H01L 23/02* (2006.01)

(52) U.S. Cl. . 257/680; 257/433; 257/434; 257/E31.117; 257/E31.127

(58) Field of Classification Search ............... 257/433, 257/432, 435, E31.127, E31.117, 710, 704, 257/81, 99, 100, 680, 681, 686, E33.056–E33.061, 257/E33.07, E31.118, E23.18, 434; 438/65, 438/48, 64, 69; 174/521
See application file for complete search history.

(56) References Cited

U.S. PATENT DOCUMENTS

| 5,122,861 | A | 6/1992 | Tamura et al. | |
| 6,503,780 | B1 * | 1/2003 | Glenn et al. | 438/116 |
| 6,849,915 | B1 * | 2/2005 | Tsai | 257/432 |
| 6,940,140 | B1 | 9/2005 | Ikeda et al. | |
| 7,154,053 | B2 * | 12/2006 | Hsu | 174/564 |
| 7,405,456 | B2 * | 7/2008 | Chen et al. | 257/434 |
| 2004/0178462 | A1 * | 9/2004 | Sakaguchi et al. | 257/432 |
| 2004/0217454 | A1 * | 11/2004 | Brechignac et al. | 257/678 |
| 2004/0235217 | A1 * | 11/2004 | Prior | 438/65 |
| 2005/0082490 | A1 * | 4/2005 | Perillat | 250/370.09 |
| 2006/0024919 | A1 * | 2/2006 | Yang | 438/460 |
| 2007/0126914 | A1 | 6/2007 | Komatsu et al. | |
| 2007/0166866 | A1 * | 7/2007 | Appelt et al. | 438/64 |
| 2008/0083964 | A1 * | 4/2008 | Fujimoto et al. | 257/432 |
| 2008/0150064 | A1 * | 6/2008 | Zimmerman et al. | 257/433 |
| 2009/0045476 | A1 * | 2/2009 | Peng et al. | 257/432 |
| 2009/0146174 | A1 * | 6/2009 | Tanaka et al. | 257/99 |
| 2009/0152658 | A1 * | 6/2009 | Bolken et al. | 257/432 |
| 2010/0019339 | A1 * | 1/2010 | Walberg et al. | 257/434 |

FOREIGN PATENT DOCUMENTS

JP 61-123288 6/1986

* cited by examiner

*Primary Examiner* — Matthew C Landau
*Assistant Examiner* — Latanya Crawford
(74) *Attorney, Agent, or Firm* — McDermott Will & Emery LLP

(57) ABSTRACT

An optical semiconductor device includes: a package having a bottom portion and a sidewall portion; a semiconductor chip having an optical element formed on one surface thereof and having an opposite surface to the one surface fixed to the bottom portion of the package; a transparent member fixed to the semiconductor chip so as to cover the optical element; and a sealing resin filling a space between the package and the semiconductor chip. The sidewall portion has in an upper part thereof an overhang portion that projects toward inside of the package. The transparent member is exposed from a window portion formed by the overhang portion.

8 Claims, 2 Drawing Sheets

OPTICAL SEMICONDUCTOR DEVICE

CROSS REFERENCE TO RELATED APPLICATION

This application claims priority under 35 U.S.C. §119 on Patent Application No. 2008-013049 filed in Japan on Jan. 23, 2008, the entire contents of which are hereby incorporated by reference.

BACKGROUND OF THE INVENTION

1. Field of the Invention

The invention relates to an optical semiconductor device. More particularly, the invention relates to an optical semiconductor device in which a semiconductor chip having an optical element is resin-sealed in a package.

2. Related Art

Reduction in size of electronic equipments has been rapidly progressed in recent years. Reduction in size has therefore been increasingly demanded for optical semiconductor devices for use in the electronic equipments. Optical semiconductor devices are formed by, for example, accommodating a semiconductor chip having an optical element formed thereon in a package having a window portion, and sealing the window portion by a transparent member such as a protective glass. Conventionally, in order to reduce the size of the optical semiconductor devices, the bonding width of the transparent member is reduced as well as the distance from the outer shape of the transparent member to the outer shape of the package is reduced so that the width of a recessed sidewall portion is reduced.

An optical semiconductor device formed by directly fixing a transparent member onto a semiconductor chip having an optical element formed thereon, accommodating the resultant semiconductor chip in a recessed package, and filling the package with a sealing resin is also known in the art (for example, Japanese Laid-Open Patent Publication No. SHO61-123288). Such a resin-sealed optical semiconductor device is capable of further reduction in size and thickness as compared to an optical semiconductor device having a window portion sealed by a transparent member.

SUMMARY OF THE INVENTION

In conventional resin-sealed optical semiconductor devices, however, the height of a sidewall portion of a package needs to be lowered in order to reduce the thickness of a product. Lowering the height of the sidewall portion of the package causes overflow of a sealing resin over the sidewall portion of the package or causes bleeding of the sealing resin. Such overflow of the sealing resin and the like hinder electrical conduction between side terminals of the optical semiconductor device and also causes a defective outer contour surface.

In the resin-sealed optical semiconductor devices, the transparent member is directly fixed onto the semiconductor chip. This structure enables reduction in inclination of the top surface of the transparent member with respect to the surface on which the optical element is formed. The top surface of the transparent member can therefore be used as an optical reference surface. In order to use the top surface of the transparent member as an optical reference surface, however, the top surface of the package needs to be located lower than the top surface of the transparent member so as not to interfere with optical parts. The height of the sidewall portion of the package cannot therefore be increased, and overflow of the sealing resin is likely to occur.

In the case where the transparent member protrudes, on the other hand, unwanted incident light may enter from side end faces of the transparent member. In order to prevent entry of unwanted incident light, it is preferable to cover the side end faces of the transparent member with a sealing resin. In the conventional resin-sealed optical semiconductor devices, however, the height of the sidewall portion of the package needs to be lowered and it is therefore difficult to cover the side end faces of the transparent member with the sealing resin due to overflow of the sealing resin.

The invention is made to solve the above conventional problems and it is an object of the invention to enable implementation of a resin-sealed optical semiconductor device that is capable of using the top surface of a transparent member as an optical reference surface and is less likely to have problems such as overflow of a sealing resin.

In order to achieve the above object, an optical semiconductor device of the invention includes a package having an overhang portion projecting inward.

More specifically, an optical semiconductor device according to the invention includes: a package having a bottom portion and a sidewall portion; a semiconductor chip having an optical element formed on one surface thereof and having an opposite surface to the one surface fixed to the bottom portion of the package; a transparent member fixed to the semiconductor chip so as to cover the optical element; and a sealing resin filling a space between the package and the semiconductor chip. The sidewall portion has in an upper part thereof an overhang portion that projects toward inside of the package. The transparent member is exposed from a window portion formed by the overhang portion.

In the optical semiconductor device of the invention, even when the height of the sidewall portion of the package is lowered, the sealing resin is less likely to overflow over the side surface and to overflow due to bleeding. The top surface of the package can therefore be easily located lower than the top surface of the transparent member. As a result, the top surface of the transparent member can be used as an optical reference surface. Moreover, side end faces of the transparent member can be easily shielded from light by the sealing resin.

BRIEF DESCRIPTION OF THE DRAWINGS

FIGS. 1A and 1B show an optical semiconductor device according to an embodiment of the invention, wherein FIG. 1A is a plan view and FIG. 1B is a cross-sectional view taken along line Ib-Ib in FIG. 1A; and FIGS. 2A and 2B show a modification of the optical semiconductor device according to the embodiment of the invention, wherein FIG. 2A is a plan view and FIG. 2B is a cross-sectional view taken along line Ib-Ib in FIG. 2A.

DETAILED DESCRIPTION OF THE PREFERRED EMBODIMENTS

Embodiment

Figure 1A:
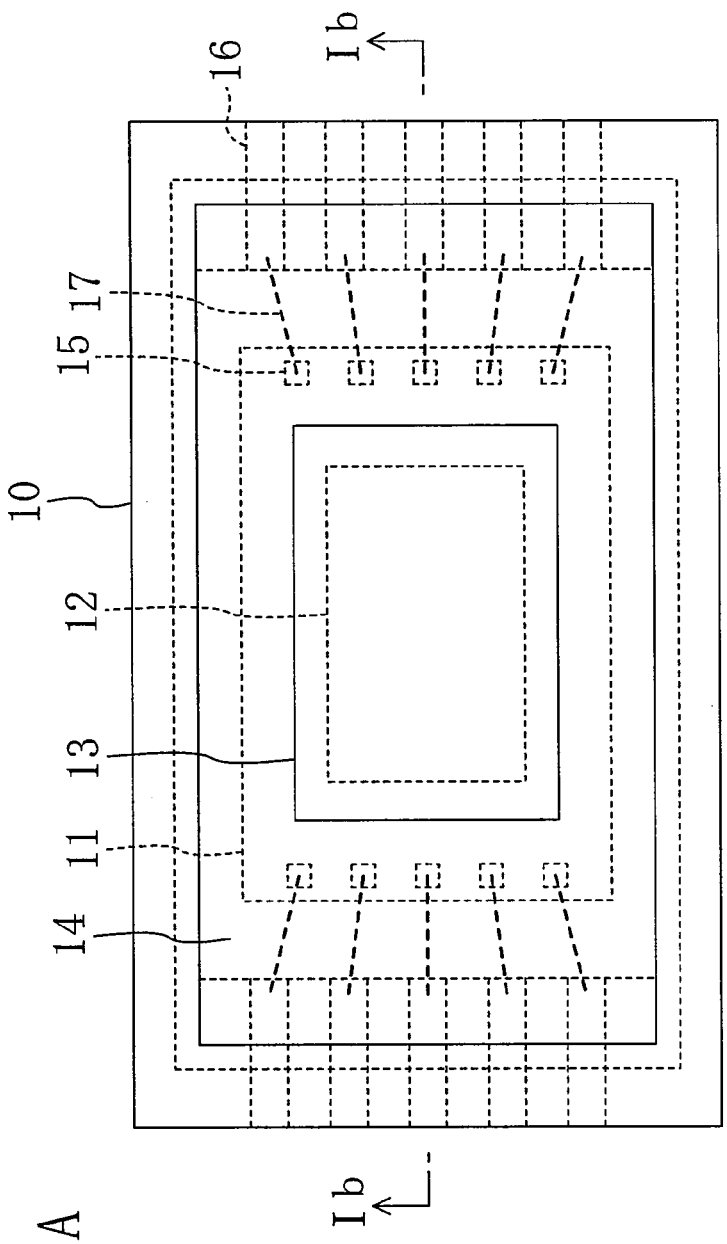
Figure 1B:
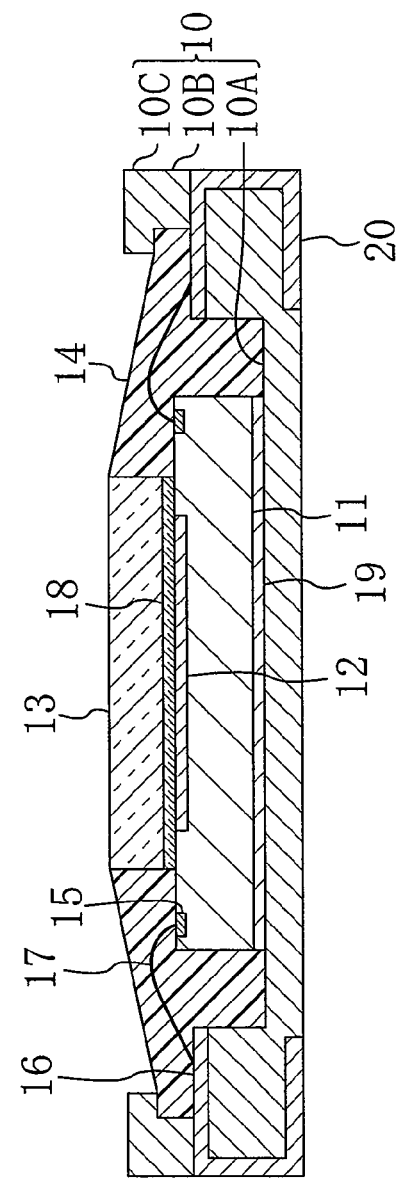
Figure 2A:
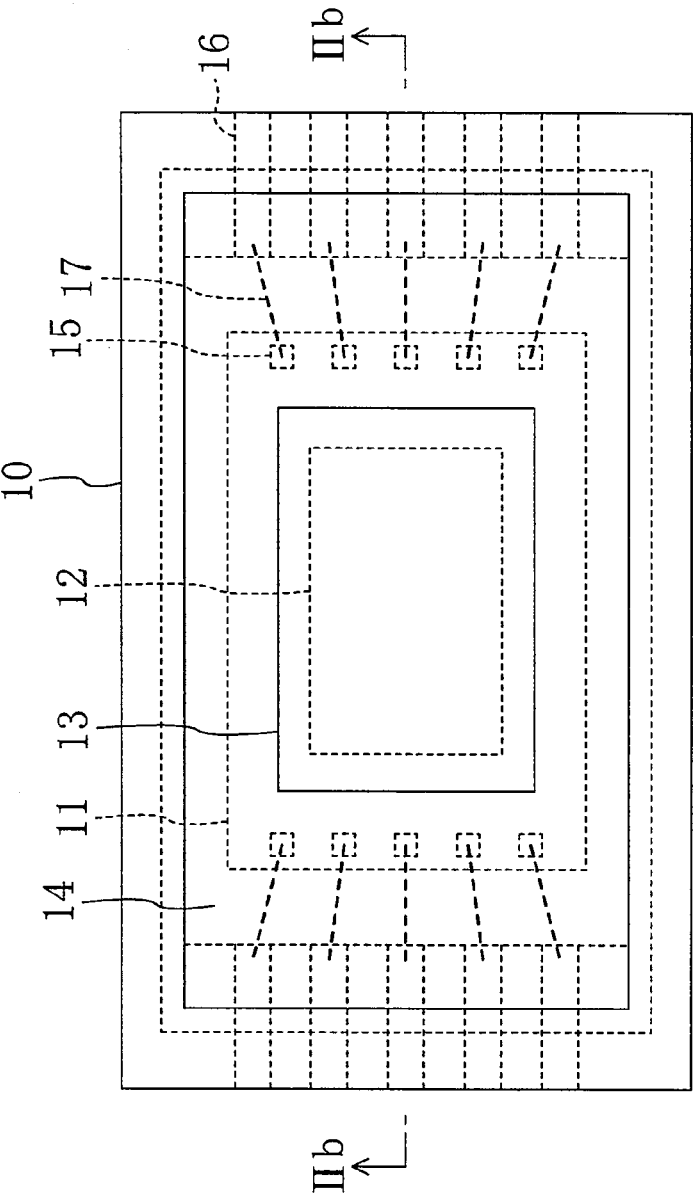
Figure 2B:
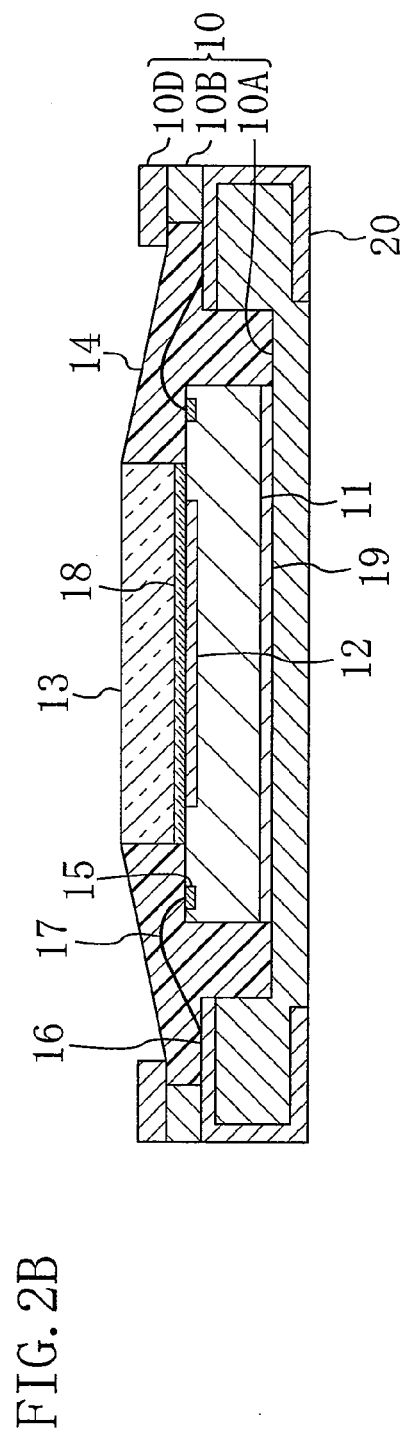

Hereinafter, an embodiment of the invention will be described with reference to the accompanying drawings. FIGS. 1A and 1B show an optical semiconductor device according to an embodiment of the invention. FIG. 1A shows a planar structure and FIG. 2B shows a cross-sectional structure taken along line Ib-Ib in FIG. 1A.

As shown in FIGS. 1A and 1B, a semiconductor chip 11 having an optical element 12 formed on one surface thereof is accommodated in a package 10 so that the surface on which the optical element 12 is formed faces upward. The package 10 has a bottom portion 10A and a sidewall portion 10B, and an overhang portion 10C projecting like eaves is formed in the upper part of the sidewall portion 10B. The package 10 thus has a window portion surrounded by the overhang portion 10C.

The semiconductor chip 11 is bonded to the bottom portion 10A of the package 10 by a die bonding (DB) material 19 such as silver paste so as to be exposed from the window portion of the package 10. A transparent member 13 made of, for example, glass is bonded onto the semiconductor chip 11 by a transparent adhesive 18 so as to cover the optical element 12. The top surface of the transparent member 13 is located higher than the top surface of the package 10.

A space between the semiconductor chip 11 and the package 10 is filled with a sealing resin 14 so that the sealing resin 14 exposes the top surface of the transparent member 13 and covers the side end faces of the transparent member 13. This structure prevents unwanted light from entering from or being emitted from the side end faces of the transparent member 13.

Internal terminals 16 and external terminals 20 electrically connected to the internal terminals 16 are formed in the package 10. The internal terminals 16 are respectively connected to electrodes 15 formed on the semiconductor chip 11 through wires 17.

In the optical semiconductor device of this embodiment, the sidewall portion 10B of the package 10 has the overhang portion 10C projecting like eaves toward inside of the package 10. Therefore, even when the sidewall portion 10B has a low height, the sealing resin 14 neither overflows to the outside over the side surface of the package 10 nor overflows to the outside due to bleeding. The top surface of the package 10 can therefore be located lower than the top surface of the transparent member 13. As a result, the top surface of the transparent member 13 can be used as an optical reference surface.

Even when the sidewall portion 10B of the package 10 has a low height, the side end faces of the transparent member 13 can be easily covered by the sealing resin 14. Note that when it is not necessary to shield the side end faces of the transparent member 13 from light, the sealing resin 13 does not have to cover the side end faces of the transparent member 13.

The optical element 12 may either be a light receiving element or a light emitting element. The package 10 may either be made of a ceramic lamination or a molded resin. Although an example in which the overhang portion 10C is formed integrally with the sidewall portion 10B is shown in FIGS. 1A and 1B, an overhang portion 10D, which is an independent plate-like member separate from the sidewall portion 10B, may be bonded to the sidewall portion 10B as shown in FIGS. 2A and 2B. In this case, the package 10 can be easily formed. The overhang portion 10D may be made of a metal or the like instead of a resin or a ceramic material. The overhang portion 10D may be bonded to the side surface of the sidewall portion 10B instead of being bonded to the top surface of the sidewall portion 10B.

The electrodes 15 and the internal terminals 16 may be connected to each other through bumps or the like instead of the wires 17. In the case where the top surface of the transparent member 13 need not be used as an optical reference surface, the top surface of the transparent member 13 does not have to be located higher than the top surface of the package 10. In this case, further reduction in thickness of the optical semiconductor device can be achieved by reducing the height of the sidewall portion of the package.

As has been described above, the invention can implement an optical semiconductor device that is capable of using the top surface of a transparent member as an optical reference surface and is less likely to have problems such as overflow of a sealing resin. The invention is useful as, for example, an optical semiconductor device in which a semiconductor chip having an optical element is resin-sealed in a package.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. An optical semiconductor device, comprising:
   a package having a bottom portion and a sidewall portion;
   a semiconductor chip having an optical element formed on one surface thereof and having an opposite surface to the one surface fixed to the bottom portion of the package;
   a transparent member fixed to the semiconductor chip so as to cover the optical element; and
   a sealing resin filling a space between the sidewall portion of the package and a side end face of the transparent member, wherein
   the sidewall portion has in an upper part thereof an overhang portion that projects toward inside of the package,
   the transparent member is exposed from a window portion formed by the overhang portion,
   a top surface of the sealing resin is located between the sidewall portion of the package and the side end face of the transparent member, said top surface of the sealing resin having a first part and a second part,
   the first part is exposed from the window portion, and
   the second part is covered by the overhang portion.

2. The optical semiconductor device according to claim 1, wherein the sealing resin covers a side end face of the transparent member.

3. The optical semiconductor device according to claim 1, wherein a top surface of the transparent member is located higher than a top surface of the sidewall portion.

4. The optical semiconductor device according to claim 1, wherein the overhang portion is formed integrally with the sidewall portion.

5. The optical semiconductor device according to claim 1, wherein the overhang portion is a plate-like member bonded to the upper part of the sidewall portion.

6. The optical semiconductor device according to claim 1, wherein the package is made of a molded resin.

7. The optical semiconductor device according to claim 1, wherein the package is made of a ceramic lamination.

8. The optical semiconductor device according to claim 1, wherein the optical element is a light receiving element or a light emitting element.

* * * * *